(12) United States Patent
Clevenger et al.

(10) Patent No.: US 6,509,612 B2
(45) Date of Patent: Jan. 21, 2003

(54) HIGH DIELECTRIC CONSTANT MATERIALS AS GATE DIELECTRICS (INSULATORS)

(75) Inventors: Lawrence A. Clevenger, LaGrangeville, NY (US); Louis L. Hsu, Fishkill, NY (US); Carl J. Radens, LaGrangeville, NY (US); Joseph F. Shepard, Jr., Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/848,431

(22) Filed: May 4, 2001

(65) Prior Publication Data

US 2002/0163039 A1 Nov. 7, 2002

(51) Int. Cl.$^7$ .................. H01L 29/76; H01L 29/94; H01L 31/062; H01L 31/113; H01L 31/119
(52) U.S. Cl. ............. 257/339; 257/340; 257/411
(58) Field of Search ................. 257/339, 336, 257/344, 356, 382, 411, 340

(56) References Cited

U.S. PATENT DOCUMENTS

| | | | | | |
|---|---|---|---|---|---|
| 5,668,028 | A | * | 9/1997 | Bryant | 438/287 |
| 5,864,160 | A | * | 1/1999 | Buynoski | 257/336 |
| 6,114,735 | A | * | 9/2000 | Batra et al. | 257/410 |
| 6,238,978 | B1 | * | 5/2001 | Huster | 438/264 |
| 6,255,165 | B1 | * | 7/2001 | Thurgate et al. | 438/257 |
| 6,271,094 | B1 | * | 8/2001 | Boyd et al. | 438/287 |
| 6,277,681 | B1 | * | 8/2001 | Wallace et al. | 438/198 |
| 6,406,945 | B1 | * | 6/2002 | Lee et al. | 257/368 |

* cited by examiner

Primary Examiner—John F. Niebling
Assistant Examiner—Walter L. Lindsay, Jr.
(74) Attorney, Agent, or Firm—McGinn & Gibb, PLLC; Marian Underweiser, Esq.

(57) ABSTRACT

A method and structure for a metal oxide semiconductor field effect transistor (MOSFET) includes patterning a gate stack (having a gate conductor layer and a gate dielectric) over a substrate and modifying the gate dielectric beneath the gate conductor, such that the gate dielectric has a central portion and modified dielectric regions adjacent the central portion. The modified dielectric regions have a lower dielectric constant than that of the gate dielectric and the central portion is shorter than the gate conductor.

16 Claims, 3 Drawing Sheets

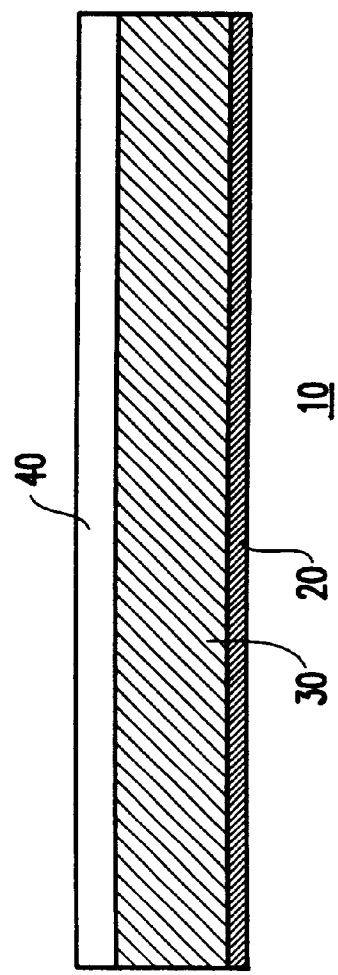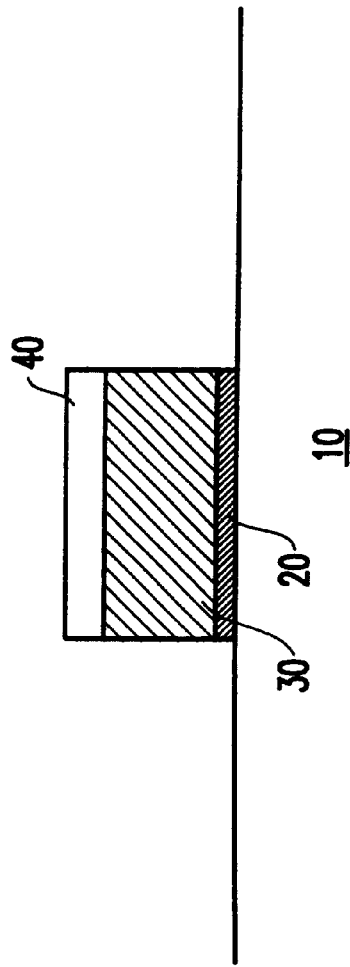
FIG.1
FIG.2

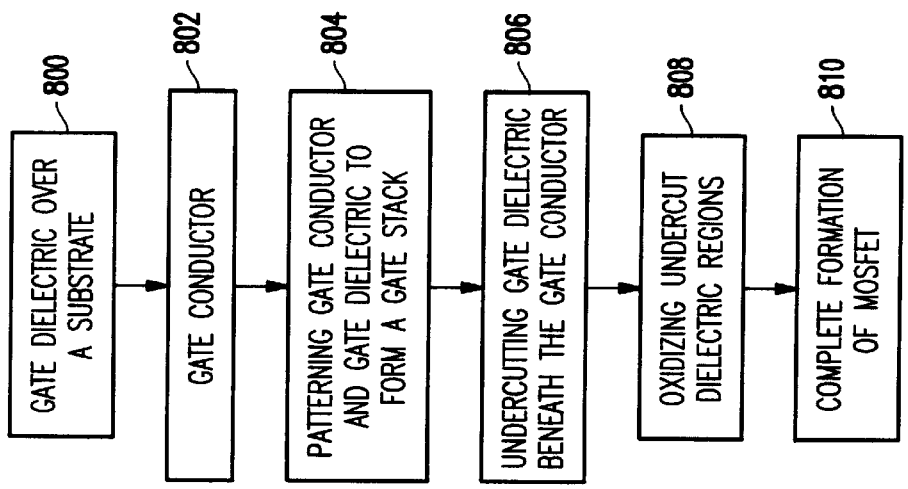
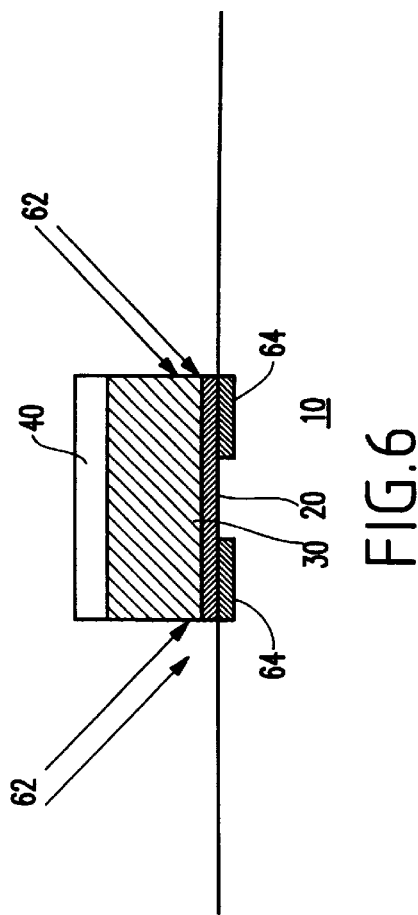
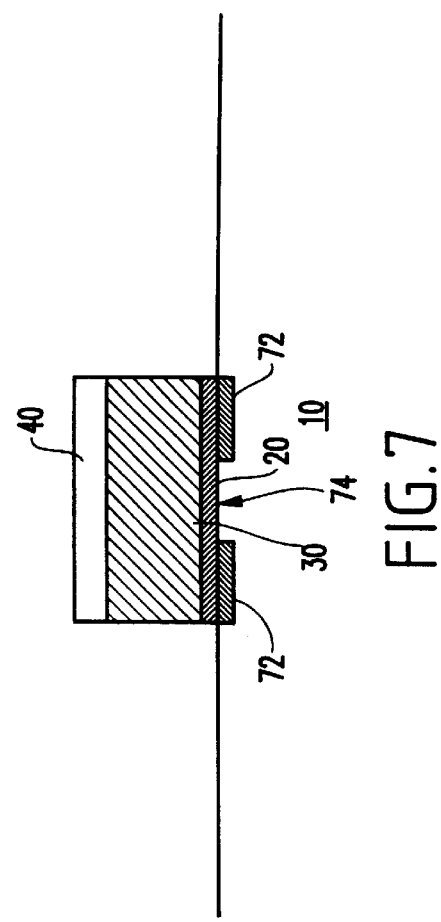

HIGH DIELECTRIC CONSTANT MATERIALS AS GATE DIELECTRICS (INSULATORS)

BACKGROUND OF THE INVENTION

1. Field of the Invention

The present invention generally relates to metal oxide semiconductor field effect transistors (MOSFET) and more particularly to an improved field effect transistor that includes an undercut region within the gate dielectric to prevent the gate dielectric from overlapping source and drain regions.

2. Description of the Related Art

Conventional MOSFETs include source and drain regions separated by a semiconducting channel region. A gate conductor overlies the channel region and a gate dielectric separates the gate conductor from the channel region. A current passing through the gate conductor changes the channel region from an insulator to a conductor, thereby forming an electrical connection between the source and drain regions. In this way, the MOSFET allows an electrical connection between the source and drain regions to be selectively enabled or disabled by passing a current through the gate conductor.

As the conventional MOSFET is reduced in size, problems with its basic operation sometimes occur. For example, there may be current leakage from the gate conductor to the channel region. In addition, if the gate insulator is not properly formed, the gate conductor may inadvertently be shorted to the channel region. Many solutions have been proposed to solve such problems.

For example, the use of a high-k dielectric such as atomic layer deposition of $Al_2O_3$ results in a 3 order magnitude lowering of gate conductor leakage. Many other solutions include using high-k dielectric gates such as $TA_2O_5$, $TiO_2$, STO and BST. However, none of these solutions subscripts discuss how to avoid overlap capacitance. Device performance is it significantly degraded due to the high-k gate dielectric overlapping the source/drain regions. Such overlap increases parasitic capacitance and causes extra delay on the critical path. This problem becomes more severe when the device is reduced in size to the deep submicron regions (e.g., less than 0.1 um). One conventional method to mitigate overlap capacitance is to grow thicker gate oxide (or bird's beaks) on the edges of the gate. However, this solution creates unwanted stress in the sensitive channel region. the stress may result in defects, leading to higher leakage current. Therefore, there is a need for a process and structure that reliably eliminates gate dielectric overlap of the source and drain regions, even when devices are manufactured to have sizes less than 0.1 um. The invention described below includes such a process and structure.

SUMMARY OF THE INVENTION

In view of the foregoing and other problems, disadvantages, and drawbacks of the conventional MOSFETs the present invention has been devised, and it is an object of the present invention to provide a structure and method for an improved field effect transistor that includes an overlap region within the gate dielectric to prevent the gate dielectric from overlapping source and drain regions.

In order to attain the object(s) suggested above, there is provided, according to one aspect of the invention, a metal oxide semiconductor field effect transistor (MOSFET) having a substrate, a gate dielectric above the substrate, a gate conductor above and aligned with the gate dielectric. The undercut dielectric regions on the ends of the gate dielectric have a lower dielectric constant material than the gate dielectric. Further, the undercut dielectric regions can be oxidized regions of the gate dielectric. The length of the gate conductor is equal to the length of the undercut dielectric regions when added to the length of the high-k gate dielectric. The undercut dielectric regions on the ends of the gate dielectric prevent the gate conductor from overlapping the source or drain regions over the high-k gate dielectric.

Another embodiment includes a substrate and a gate dielectric layer above the substrate. The gate dielectric includes central and outer regions. The central region has a higher dielectric constant than the outer regions. The gate conductor covers all of the central region and a portion of each of the outer regions of the gate dielectric layer.

Alternatively, the invention also entails a forming metal oxide semiconductor field effect transistor (MOSFET) in a method which includes forming a gate dielectric over a substrate, forming a gate conductor over the gate dielectric, patterning the gate conductor and the gate dielectric to form a gate stack, and undercutting the gate dielectric beneath the gate conductor, such that the gate dielectric has a length less than that of the gate conductor. The undercutting forms undercut dielectric regions adjacent the gate dielectric. The undercut dielectric regions have a lower dielectric constant than that of the gate dielectric. The invention may include oxidizing the undercut regions to form undercut dielectric regions. Further, the undercut dielectric regions could be formed using an angled oxygen implant into the undercut dielectric regions and annealing the gate stack in an oxygen-containing ambient.

As shown above, the invention creates undercut regions that have a gate dielectric with a lower dielectric constant than the main high-k gate dielectric to reduce the overall effective channel length. Therefore, even if the gate dielectric were overlapped, the overlaop capacitance is small. Further, with the inventive process, regions and source and drain implants are self-aligned using the gate conductor and hard mask. Therefore, it is highly unlikely that the gate dielectric will be misaligned with the source and drain regions with the invention.

BRIEF DESCRIPTION OF THE DRAWINGS

The foregoing and other objects, aspects and advantages will be better understood from the following detailed description of preferred embodiments of the invention with reference to the drawings, in which:

FIG. 1 is a schematic diagram of a partially completed transistor according to the invention;

FIG. 2 is a schematic diagram of a partially completed transistor according to the invention;

FIG. 6 is a schematic diagram of a partially completed transistor according to a second embodiment of the invention;

FIG. 7 is a schematic diagram of a partially completed transistor according to the second embodiment of the invention; and FIG. 8 is a flowchart illustrating a method of the invention.

DETAILED DESCRIPTION OF PREFERRED EMBODIMENTS OF THE INVENTION

Figure 3:
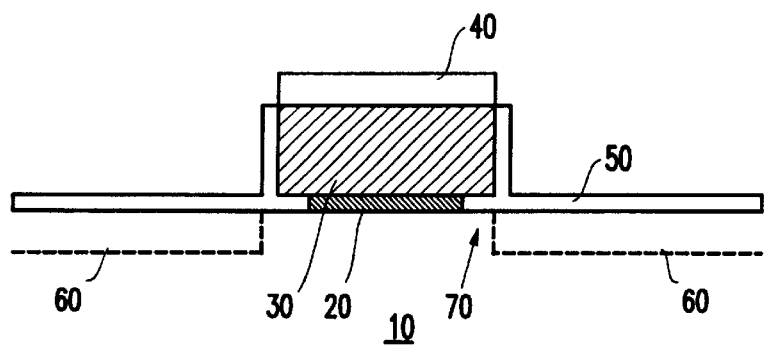
FIG. 3 is a schematic diagram of a partially completed transistor according to the invention.

In order to solve the above-mentioned problems, the invention uses a high-k dielectric to form the gate dielectric of a MOS device. However, the invention avoids gate and source/drain overlap capacitance by forming undercut regions in the gate dielectric. The invention utilizes a self-aligned process to modify only the edges of the gate dielectric, to significantly reduce overlap capacitance. The invention does not create stress which would damage the gate structure (e.g., no bird's beak). Thus, with the invention, defect induced leakage current can be eliminated.

While a MOSFET structure is utilized to illustrate the invention, as would be known by one ordinarily skilled in the art when presented with this disclosure, the invention is equally applicable to many other similar structures. For example, the invention can easily be implemented to form high-k gate dielectric for the stack-gate of a flash memory device. With the invention, the inter-poly dielectric as channel as the floating gate dielectric can all be made with high-k material to improve the read, write and erasure performance of the device.

Referring now to the drawings, FIG. 1 shows a substrate 10, such as single crystal silicon and/or silicon-on-insulator (SOI), a high-k thin film 20 such as HfOx, AlOx, TaOx, TiOx, etc., a gate conductor 30 such doped low pressure chemical vapor deposition (LPCVD) polysilicon, a cap layer, anti-reflection coating (ARC), and/or hard mask 40 formed using CVD. The isolation regions such as shallow trench isolation (STI), silicon over insulator (SOI) substrate, etc. are well known in the art and therefore are not shown in FIG. 1, so as to not unnecessarily obscure the salient features of the invention. FIG. 2 shows a patterned gate stack structure having layers 20, 30 and 40. The gate stack structure can be patterned by any well-known process, such as using conventional photolithographic patterning and dry etching techniques.

FIG. 3 shows a sidewall thermal oxidation 50 formed using an anneal in an oxygen-containing ambient, such as rapid thermal oxidation (RTO). Such processing also oxidizes a portion 70 of the gate dielectric 20 under the gate conductor 30. Alternatively, an isotropic etching, such as down-stream plasma, or diluted wet etch, may be used to precisely undercut the high-k gate dielectric 20 in undercut regions 70 prior to the formation of the sidewall oxidation 60. The overlap region 70 thus formed, replaces the high-k gate dielectric 20, with a reduced-k sidewall oxidation 50. A lightly-doped source/drain extension doped region 60 can then be formed by ion implantation.

The dimension of region 70 is preferably in the range of 0.005 um to 0.01 um, in this example. However, the invention is not strictly limited to these dimensions. To the contrary, the concept of the invention is to undercut or oxidize a portion 70 of the gate dielectric 20. One ordinarily skilled in the art (in light of this disclosure) could easily modify the amount that is undercut depending upon the specific requirements of the device being produced.

An important feature of the invention is that by providing regions 70 that have a lower dielectric constant (e.g., lower k) than the high-k gate dielectric 20, the overall length of the high-k gate dielectric 20 is reduced. The undercutting process is self-aligned and therefore the resulting structure is symmetrical. Further, the inventive process provides that the regions 70 and source and drain implants 60 are self-aligned by the gate conductor 30 and hard mask 40.

Figure 4:
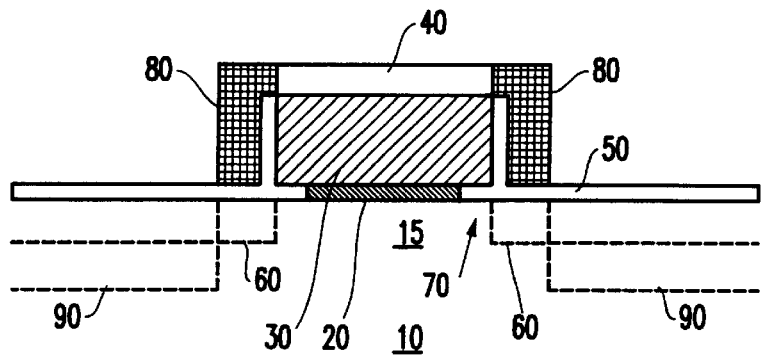
FIG. 4 is a schematic diagram of a partially completed transistor according to the invention.

FIG. 4 shows sidewall spaces 80 such as silicon nitride formed by LPCVD and anisotropic dry etching, such as reactive ion etching (RIE). A source/drain ion implant 90 is preferably provided after the spacer 80 formation. A rapid thermal anneal (RTA) activation of the extension 60 and source/drain 90 implant redistributes the implant dopants to provide lateral overlap and electrical continuity between the channel region 15 under the high-k gate dielectric 20, overlap region 70, and extension 60.

Figure 5:
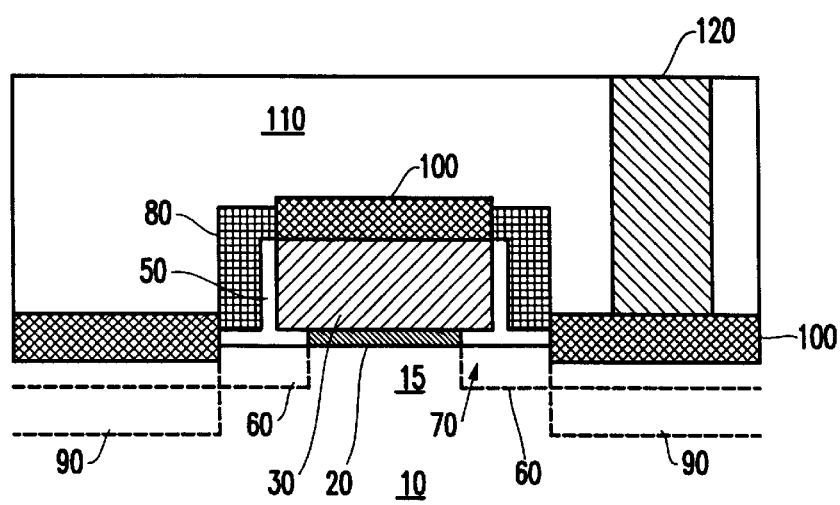
FIG. 5 is a schematic diagram of a completed transistor according to the invention.

FIG. 5 shows the completed structure using conventional CMOS processing including salicide 100 (self-aligned silicide) over the gate 30 and source/drain 60, such as CoSix; inter-level dielectric 100, such as doped glass BPSG; and W contact stud 120 formed using lithography and dry etching.

FIGS. 6 and 7 illustrate a second embodiment that is similar to the previous embodiment, except that a blank angled oxygen implant is used to modify the oxygen content of the high-k dielectrics (e.g., $Al_2O_3$). The same items discussed above with respect to FIGS. 1–5 are identified with the same numbers in FIGS. 6 and 7. In the embodiment shown in FIGS. 6 and 7, after the angled implant, the gate oxide is regrown on the sidewalls of the gate, so that the dielectric constant of high-k dielectric material exposed at the edges of the gate structure is lowered. This embodiment requires no undercutting, and thus the process is more controlled and cleaner than the previous embodiment.

More specifically, as shown in FIG. 6, an angled oxygen ion implantation 62 is made to deposit oxygen species 64 below the high-k dielectric 20 in the crystalline silicon and the near interfacial region 15. An energy sufficient for the oxygen to pass through the gate conductor will be required in the angled implant.

In FIG. 7, the gate stack is annealed at temperatures and times sufficient to form $SiO_2$ 72 in the implanted subsurface regions. This anneal process will also form an alumino-silicate 74 (i.e., an alloy of $Al_2O_3$ and $SiO_2$) at the interface 15 of the high-k dielectric 20 and silicon substrate 10. This annealing is preferably performed in an inert ambient (e.g., N2 or Ar) to prevent premature oxidation of the gate conductor 30 sidewall and oxidation of the high-k dielectric 20 and silicon 10 interface. Temperatures and times will be dependent upon the tool used, i.e., RTP or furnace. For example, in furnace oxidation, temperatures should be greater than 700° C. with partial pressures of oxidation less than 1 ppm.

Either of the processes outlined above will place a second low-k dielectric in series with the first high-k dielectric and thus lower the stack capacitance at either end of the channel 15. An expression which describes the effect can be written using the approximation for multiple capacitors in series is $1/C_{tot}=1/C_1+1/C_2$, where $C_{tot}$=total capacitance of two capacitors in series, $C_1$=capacitance of 1st capacitor= $k_1k_0A_1/d$, $C_2$=capacitance of 2nd capacitor=$k_1k_0A_2/d$, where: $k_1$, and $k_2$=the dielectric constants of the high-k film and subsurface insulator, $A_1$ and $A_2$=surface area of capacitors, $d_1$, and $d_2$=thickness of the high-k film and subsurface insulator $k_0$=permittivity of free space.

If it is assumed that the thickness and dielectric constant of the high-k film remain fixed, then the overall capacitance of the stack can be engineered by changing the thickness or dielectric constant of the subsurface material. With the invention, it is possible to change either parameter via an increase or decrease of the angled implantation energy and dose of the oxygen atoms. In so doing, the overlay capacitance at either end of the channel region can be effectively mitigated.

FIG. 8 is a flowchart illustrating the processing of the invention. More specifically, in item 800, the invention first forms a gate dielectric 20 over a substrate 10. In this case a high-k dielectric is used. Then in item 802 the invention forms a gate conductor 30 over the gate dielectric 20. Also, in item 804 of the invention, patterning of the gate conductor 30 and the gate dielectric 20 forms a gate stack. Further, in item 806 the invention modifies the gate dielectric 20 at the edge of the gate conductor 30, for example, by undercutting 70 the gate dielectric 20 beneath the gate conductor 30, or oxygen ion angle implanting. In item 808 the invention reduces the dielectric constant or increases the dielectric thickness in those areas, for example, by oxidizing the undercut dielectric regions 20. Then the remaining standard formation of the MOSFET of stacked dielectric, etc. is completed as shown in item 810 of the invention.

As shown above, the invention creates regions 70 that have a lower dielectric constant than the high-k gate dielectric 20 to reduce the effective channel length. The undercutting process is self-aligned. Further, with the inventive process, regions 70 and source and drain implants 60 are self-aligned using the gate conductor 30 and hard mask 40. Therefore, it is not possible that the gate dielectric 20 will be misaligned with the source and drain regions 60 with the invention.

While the invention has been described in terms of preferred embodiments, those skilled in the art will recognized that the invention can be practiced with modification within the spirit and scope of the appended claims.

What is claimed is:

1. A metal oxide semiconductor field effect transistor (MOSFET) comprising:
   a substrate;
   a gate dielectric layer above said substrate, said gate dielectric including a central region and outer regions co-planar with each other, wherein said central region has a higher dielectric constant than said outer regions; and
   a gate conductor above said gate dielectric layer, said gate conductor covering all of said central region and at least a portion of each of said outer regions of said gate dielectric layer,
   wherein said outer regions of said gate dielectric contact said gate conductor.

2. The MOSFET in claim 1, wherein said central region comprises one of $HfO_x$, $AlO_x$, $TaO_x$, and $TiO_x$.

3. The MOSFET in claim 1, wherein said outer regions comprise oxidized regions of said central region.

4. The MOSFET in claim 1, wherein a length of said gate conductor is equal to a length of said central region added to a length of said outer regions.

5. The MOSFET in claim 1, further comprising source and drain regions within said substrate and on opposite sides of said central portion of said gate dielectric layer, wherein said outer regions prevent said gate dielectric from substantially overlapping either of said source and drain regions.

6. A meal oxide semiconductor field effect transistor (MOSFET) comprising:
   a substrate;
   a gate dielectric above said substrate, wherein said gate dielectric has a higher dielectric constant than adjacent co-planar materials; and
   a gate conductor above and aligned with said gate dielectric, said gate conductor being longer than said gate dielectric.

7. The MOSFET in claim 6, further comprising low dielectric regions on ends of said gate dielectric, wherein said low dielectric regions have a lower dielectric constant than said gate dielectric.

8. The MOSFET in claim 7, wherein said low dielectric regions comprise oxidized regions of said gate dielectric.

9. The MOSFET in claim 7, wherein a length of said gate conductor is equal to a length of said low dielectric regions added to a length of said gate dielectric.

10. A metal oxide semiconductor field effect transistor (MOSFET) comprising:
    a substrate;
    a gate dielectric above said substrate, wherein said gate dielectric has a higher dielectric constant than adjacent, co-planar materials;
    a gate conductor above and aligned with said gate dielectric, said gate conductor being longer than said gate dielectric;
    low dielectric regions on ends of said gate dielectric, wherein said low dielectric regions have a lower dielectric constant than said gate dielectric; and
    source and drain regions within said substrate and on opposite sides of said gate dielectric, wherein said low dielectric regions prevent said gate dielectric from substantially overlapping either of said source and drain regions.

11. The MOSFET in claim 1, wherein said outer regions of said gate dielectric are positioned along a bottom portion of said gate conductor and along sidewalls of said gate conductor.

12. The MOSFET in claim 6, wherein said adjacent co-planar materials are positioned along a bottom pardon of said gate conductor and along sidewalls of said gate conductor.

13. A metal oxide semiconductor field effect transistor (MOSFET) comprising:
    a substrate;
    a gate dielectric layer above said substrate, said gate dielectric including a central region and outer regions wherein said central region has a higher dielectric constant than said outer regions;
    a gate conductor above said gate dielectric layer, said gate conductor covering all of said central region and at least a portion of each of said outer regions of said gate dielectric layer, wherein said outer regions of said gate dielectric are positioned along a bottom portion of said gate conductor and along sidewalls of said gate conductor, and wherein said outer regions of said gate dielectric contact said gate conductor; and
    source and drain regions within said substrate and on opposite sides of said central portion of said gate dielectric layer, wherein said outer regions prevent said gate dielectric from substantially overlapping either of said some and drain regions.

14. The MOSFET in claim 13, wherein said central region comprises one of $HfO_x$, $AlO_x$, $TaO_x$, and $TiO_x$.

15. The MOSFET in claim 13, wherein said outer regions comprise oxidized regions of said central region.

16. The, MOSFET in claim 13, wherein a length of said gate conductor is equal to a length of said central region added to a length of said outer regions.

* * * * *